United States Patent
Chen et al.

(10) Patent No.: US 11,282,804 B2
(45) Date of Patent: Mar. 22, 2022

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Wei-Chih Chen, Taipei (TW);
Hung-Jui Kuo, Hsinchu (TW);
Yu-Hsiang Hu, Hsinchu (TW);
Sih-Hao Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 8 days.

(21) Appl. No.: 16/714,811

(22) Filed: Dec. 16, 2019

(65) Prior Publication Data

US 2020/0118958 A1 Apr. 16, 2020

Related U.S. Application Data

(63) Continuation of application No. 15/884,254, filed on Jan. 30, 2018, now Pat. No. 10,510,704.

(51) Int. Cl.
*H01L 23/00* (2006.01)
*H01L 23/29* (2006.01)

(52) U.S. Cl.
CPC .............. *H01L 24/19* (2013.01); *H01L 24/02* (2013.01); *H01L 24/24* (2013.01); *H01L 24/25* (2013.01); *H01L 23/295* (2013.01); *H01L 24/13* (2013.01); *H01L 2224/024* (2013.01); *H01L 2224/0236* (2013.01); *H01L 2224/02331* (2013.01); *H01L 2224/02371* (2013.01); *H01L 2224/02381* (2013.01); *H01L 2224/13024* (2013.01); *H01L 2224/2405* (2013.01); *H01L 2224/24011* (2013.01); *H01L 2224/24137* (2013.01); *H01L 2224/24265* (2013.01); *H01L 2224/2518* (2013.01); *H01L 2224/25171* (2013.01); *H01L 2924/066* (2013.01); *H01L 2924/0645* (2013.01); *H01L 2924/0665* (2013.01)

(58) Field of Classification Search
None
See application file for complete search history.

(56) References Cited

U.S. PATENT DOCUMENTS

| | | | |
|---|---|---|---|
| 6,319,739 B1 * | 11/2001 | Pollock | H01L 21/56 257/687 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |

(Continued)

*Primary Examiner* — Long Pham
(74) *Attorney, Agent, or Firm* — JCIPRNET

(57) ABSTRACT

A package structure and a method of forming the same are provided. The package structure includes a die, an encapsulant, a polymer layer and a redistribution layer. The encapsulant laterally encapsulates the die. The polymer layer is on the encapsulant and the die. The polymer layer includes an extending portion having a bottom surface lower than a top surface of the die. The redistribution layer penetrates through the polymer layer to connect to the die.

20 Claims, 17 Drawing Sheets

(56) References Cited

U.S. PATENT DOCUMENTS

| | | |
|---|---|---|
| 9,368,460 B2 | 6/2016 | Yu et al. |
| 9,372,206 B2 | 6/2016 | Wu et al. |
| 9,496,189 B2 | 11/2016 | Yu et al. |
| 2016/0056126 A1* | 2/2016 | Yu .......................... H01L 21/565 |
| | | 257/737 |

* cited by examiner

PACKAGE STRUCTURE AND METHOD OF MANUFACTURING THE SAME

CROSS-REFERENCE TO RELATED APPLICATION

This application is a continuation application of and claims the priority benefit of a prior application Ser. No. 15/884,254, filed on Jan. 30, 2018, now allowed. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness.

DETAILED DESCRIPTION

Figure 1A:
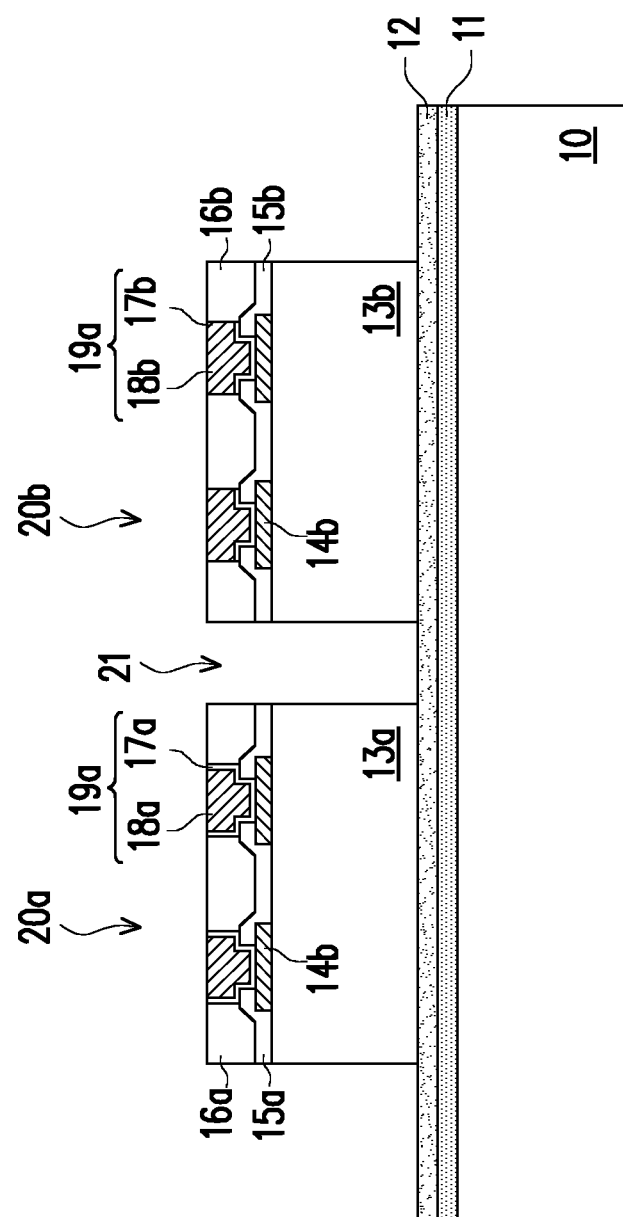
FIG. 1A to FIG. 1H are schematic cross-sectional views illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGs. The spatially relative terms are intended to encompass different orientations of the device in use or operation in addition to the orientation depicted in the FIGs. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 4:
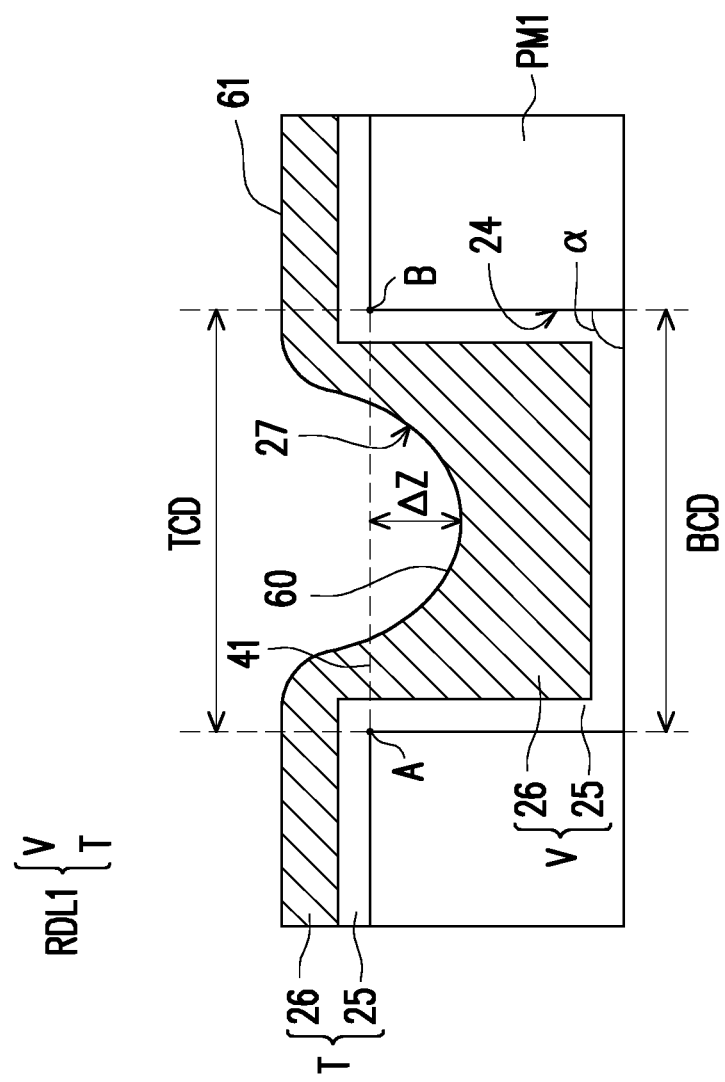
FIG. 4 is an enlarged schematic cross-sectional view of a RDL according to some embodiments of the disclosure.

FIG. 1A to FIG. 1H are schematic cross-sectional views illustrating a forming method of a package structure according to a first embodiment of the disclosure. FIG. 4 is a schematic cross-sectional view illustrating a RDL according to some embodiments of the disclosure.

Referring to FIG. 1A, a carrier 10 is provided. The carrier 10 may be a glass carrier, a ceramic carrier, or the like. In some embodiments, the carrier 10 has a de-bonding layer 11 formed thereon. The de-bonding layer 11 is formed by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

In some embodiments, a die 20a and a die 20b are attached side by side to the de-bonding layer 11 over the carrier 10 through an adhesive layer 12 such as a die attach film (DAF), silver paste, or the like. In some embodiments, the die 20a and the die 20b may be any one of a system-on-chip (SoC) device, a memory device, or any other suitable types of devices. In some embodiments, the die 20a and the die 20b may respectively be an application-specific integrated circuit (ASIC) chip, an analog chip, a sensor chip, a wireless and radio frequency chip, a voltage regulator chip, a memory chip or the like. The die 20a and the die 20b may be the same types of dies or the different types of dies. In some embodiments, the two dies 20a and 20b are two small die partitions with different function of a larger single die. The size (refers to the height and/or the width) of the two dies 20a and 20b may be the same or different. In some embodiments, a gap 21 is existed between the two dies 20a and 20b. The number of the dies attached to the carrier 10 is not limited to that is shown in FIG. 1A. In some other embodiments, one die or more than two dies are attached to the carrier 10.

In some embodiments, the two dies 20a and 20b have similar structures. For the sake of brevity, the die 20a is taken for example. The die 20a includes a substrate 13a, a pad 14a, a passivation layer 15a, connectors 19a and a protection layer 16a.

In some embodiments, the substrate 13a is made of silicon or other semiconductor materials. Alternatively or additionally, the substrate 13a includes other elementary semiconductor materials such as germanium, gallium arsenic, or other suitable semiconductor materials. In some embodiments, the substrate 13 may further include other features such as various doped regions, a buried layer, and/or an epitaxy layer. Moreover, in some embodiments, the substrate 13a is made of an alloy semiconductor such as silicon germanium, silicon germanium carbide, gallium arsenic phosphide, or gallium indium phosphide. Furthermore, the substrate 13a may be a semiconductor on insulator such as silicon on insulator (SOI) or silicon on sapphire.

The pads 14a may be a part of an interconnection structure (not shown) and electrically connected to the devices (not shown) formed on the substrate 13a. In some embodiments, the devices may be active devices, passive devices, or a combination thereof. In some embodiments, the devices are integrated circuit devices. The devices 16 are, for example, transistors, capacitors, resistors, diodes, photodiodes, fuse devices, or the like. The passivation layer 15a is formed over the substrate 13a and covers a portion of the pads 14a. A portion of the pads 14a is exposed by the passivation layer 15a and serves as an external connection of the die 20a. The passivation layer 15a includes an insulating material such as silicon oxide, silicon nitride, polymer, or a combination thereof. The polymer includes polybenzoxazole (PBO), polyimide (PI), benzocyclobutene (BCB), a combination thereof or the like, for example.

The protection layer 16a is located over the passivation layer 15a and aside the connectors 19a to cover the sidewalls of the connectors 19a. The protection layer 16a may be formed of a material the same as or different from that of the passivation layer 15a.

The connectors 19a are formed on and electrically connected to the pads 14a exposed by the passivation layer 15a. The connectors 19a are formed on and electrically connected to the pads 14a not covered by the passivation layer 15a. The connector 19a includes solder bumps, gold bumps, copper bumps, copper posts, copper pillars, or the like. The cross section shape of the connector 19a may be T-shaped, square or rectangle, but the disclosure is not limited thereto. The sidewalls of the connector 19a may be straight or inclined. In some embodiments, the connector 19a includes a seed layer 17a and a conductive post 18a. The seed layer 17a is a copper seed layer or other suitable metal seed layer. In some embodiments, the seed layer 17a is a composite layer including titanium and copper. The conductive post 18a includes copper, for example. In some embodiments, the seed layer 17a covers and surrounds the sidewalls and the bottom surfaces of the conductive posts 18a, and is located between the conductive posts 18a and the protection layer 16a, between the conductive posts 18a and the passivation layer 15a, and between the conductive posts 18a and the pads 14a. That is, the conductive post 18a is separated from the protection layer 16a by the seed layer 17a therebetween. In some embodiments of the disclosure, the connector 19a may be formed by the method described as below.

FIG. 3A to FIG. 3F are schematic cross-sectional views illustrating a forming method of the connectors 19a and the protection layer 16a of the die 20a according to some embodiments of the disclosure.

Figure 3B:
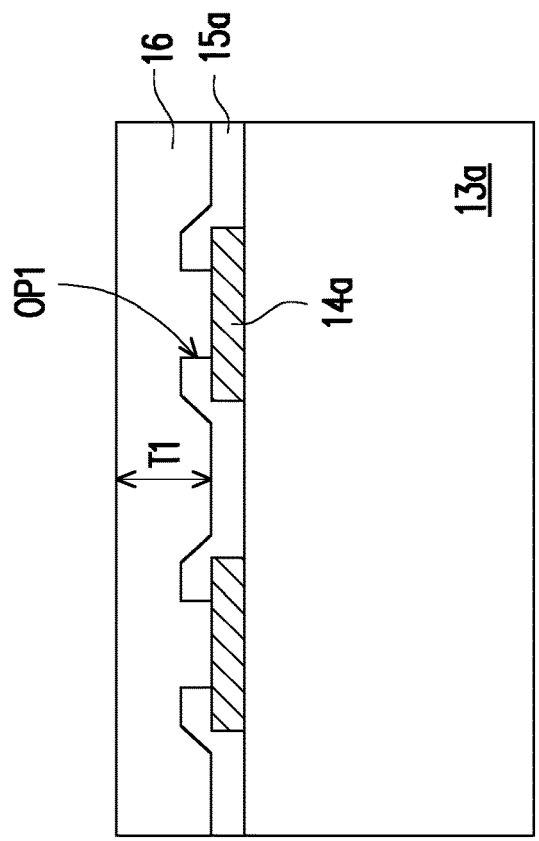
FIG. 3A to FIG. 3F are schematic cross-sectional views illustrating a method of forming a die according to some embodiments of the disclosure.
Figure 3A:
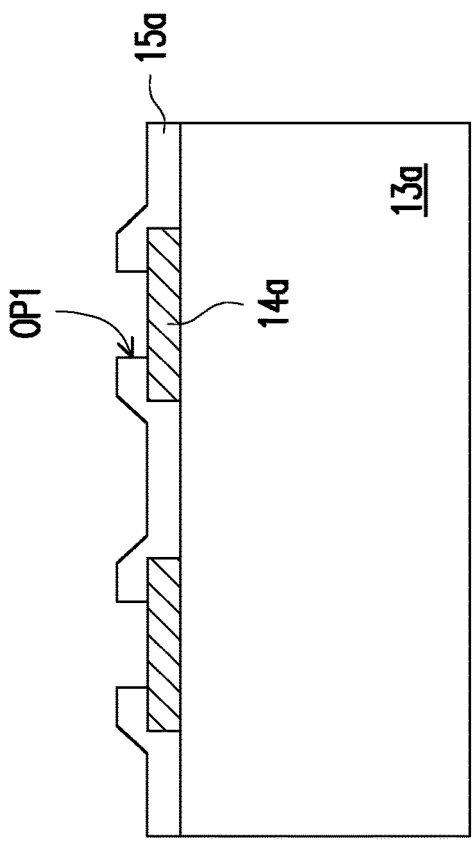

Referring to FIG. 3A and FIG. 3B, the passivation layer 15a with a plurality of openings OP1 is formed on the pads 14a and the substrate 13a. The openings OP1 expose portions of the top surface of the pads 14a. The passivation layer 15a may be formed by firstly forming a passivation material layer over the substrate 13a and the pads 14a, thereafter, a laser drilling process or exposure and development processes is/are performed to remove a portion of the passivation material layer on the pads 14a, so as to form the passivation layer 15a having a plurality of openings OP1.

A protection material layer 16 is formed on the passivation layer 15a and on the pads 14a. The protection material layer 16 covers the passivation layer 15a, and fills into the openings OP1 to cover the exposed top surfaces of the pads 14a. The material of the protection material layer 16 may be the same as or different from the material of the passivation layer 15a. In some embodiments, the protection material layer 16 includes a non-shrinkage material. The non-shrinkage material includes, epoxy, phenol, copolymer, or a combination thereof. In some embodiments, the copolymer is formed through a cross-linking reaction between a pre-copolymer and photo acid. The forming method of the protection material layer 16 includes a spin coating process and a soft bake process, for example. In some embodiments, the temperature of the soft bake process ranges from 80° C. to 115° C. Herein, non-shrinkage material refers to a material substantially does not shrink or the shrinkage rate thereof is very low after a curing process is performed in subsequent process. The shrinkage rate of the non-shrinkage material is less than 2%, for example. In some embodiments, the shrinkage rate of the non-shrinkage material is 0, that is, the non-shrinkage material does not shrink.

Figure 3D:
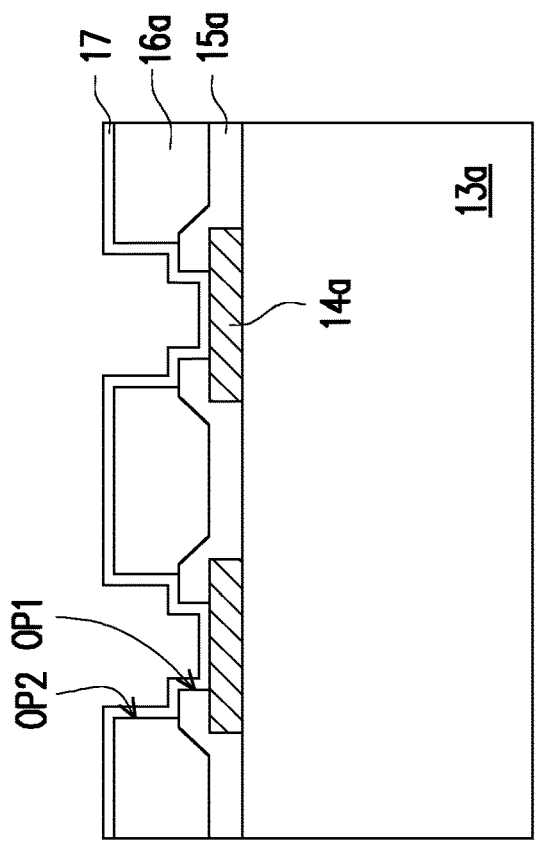
Figure 3C:
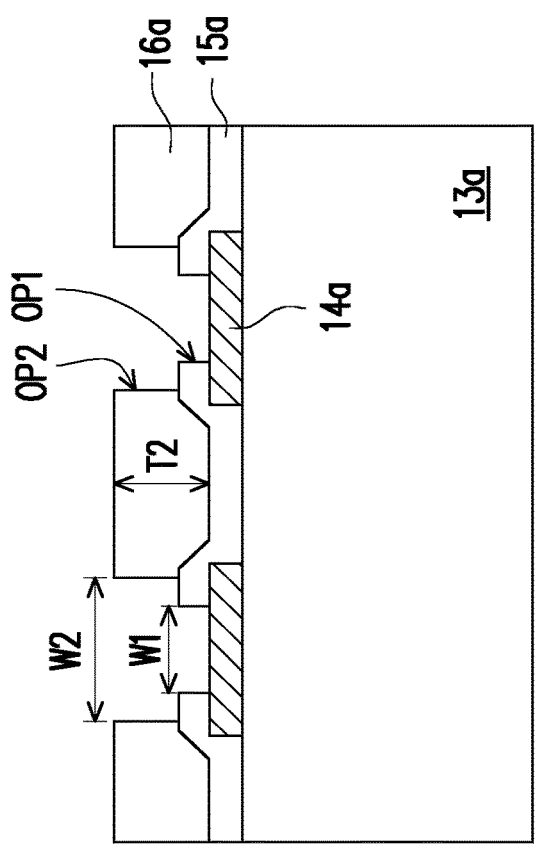

Referring to FIG. 3B and FIG. 3C, the protection material layer 16 is patterned to form a protection layer 16a with a plurality of openings OP2, and the openings OP1 are exposed. In some embodiments, the openings OP2 and the openings OP1 are holes, exposing portions of the top surfaces of the pads 14a. The openings OP2 are located over and in spatial communication with the openings OP1. In other words, the openings OP2 and the openings OP1 are partially overlapped when projected to a top surface of the substrate 13a. The sidewalls of the openings OP1 and OP2 may be straight or inclined. The width W2 of the opening OP2 may be larger than or equal to the width W1 of the opening OP1.

Referring to FIG. 3B and FIG. 3C, in some embodiments, the patterning method of the protection material layer 16 includes exposure and development processes, and a curing process (or referred as hard bake process) is further performed to cure the protection layer 16a. In some embodiments, the temperature of the curing process is higher than the temperature of the soft bake process, and ranges from 170° C. to 230° C. In some embodiments, the temperature of the curing process is higher than 170° C. The shrinkage rate of the protection layer 16a may be calculated according to Equation 1:

$$\text{shrinkage rate} = |T1 - T2|/T1 \times 100\%,$$

wherein T1 refers to the thickness of the protection material layer 16 after the soft bake process is performed, T2 refers to the thickness of the protection layer 16a after the curing process is performed. In the embodiments in which the protection material layer 16 is formed of the non-shrinkage material, the shrinkage rate of the non-shrinkage material is in a range of 0 to 2%. In other word, the ratio of T2 to T1 ranges from 98% to 100%.

Referring to FIG. 3D, a seed layer 17 is formed over the substrate 13a by a physical vapor deposition (PVD) process such as a sputtering process. In some embodiments, the seed layer 17 is a conformal seed layer. That is, the seed layer 17 has a substantially equal thickness extending along the region on which the seed layer 17 is formed. In detail, the seed layer 17 covers the top surface of the protection layer 16a, and fills into the openings OP2 and OP1 to cover the sidewalls and bottom surfaces of the openings OP2 and OP1. In other words, the seed layer 17 covers the top surface and sidewalls of the protection layer 16a, the sidewalls and a portion of the top surface of the passivation layer 15a, and portions of the top surfaces of the pads 14a. The seed layer 17 is in electrical contact with the top surface of the pad 14a.

Figure 3F:
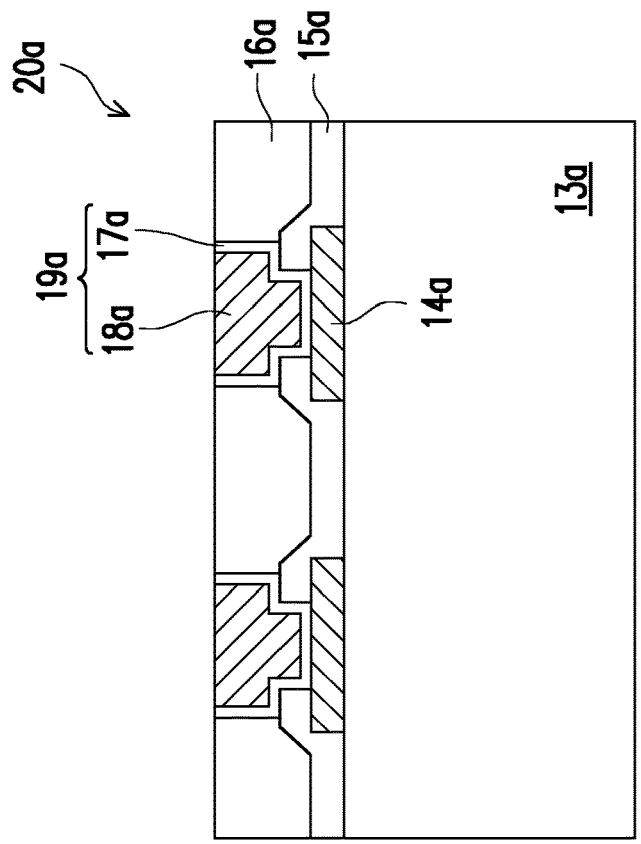
Figure 3E:
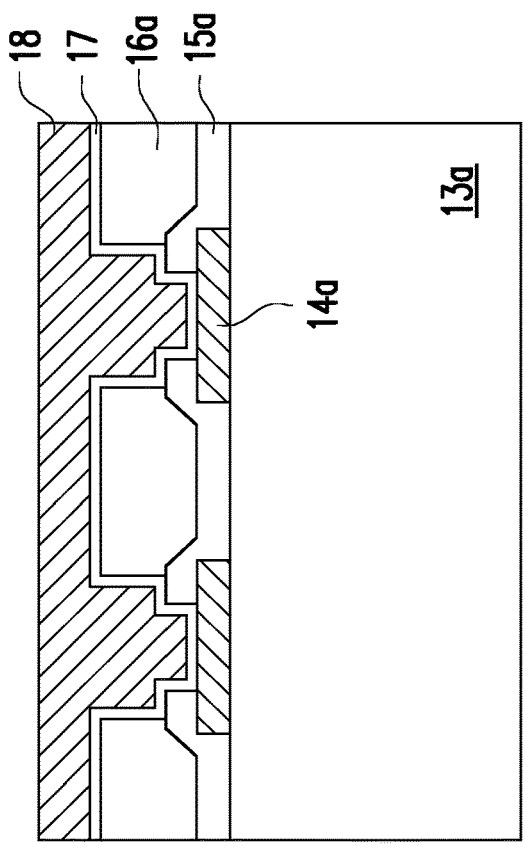

Referring to FIG. 3E, a conductive layer 18 is then formed on the seed layer 17 by, for example, an electroplating process. The conductive layer 18 covers the top surface of the seed layer 17, and fills into the openings OP1 and OP2, so as to cover the sidewalls and bottom surfaces of the seed layer 17.

Referring to FIG. 3E and FIG. 3F, a planarization process is performed to remove the seed layer 17 and the conductive layer 18 over the top surface of the protection layer 16a, and the seed layer 17a and the conductive post 18a in the openings OP1 and OP2 are remained. The seed layer 17a and the conductive post 18a form the connector 19a. The planarization process includes a polishing or grinding process, such as a chemical mechanical polishing (CMP) process. In some embodiments, the top surface of the protection layer 16a, the top surface of the seed layer 17a and the top surface of the conductive post 18a are substantially coplanar with each other.

Referring to FIG. 3F, the die 20a is thus completed. In this embodiment, since the protection layer 16a is formed before the connector 19a is formed, and the protection layer 16a is formed of a non-shrinkage material, the deformation of the protection layer 16a or bubble issue that may occur in the protection layer 16a are effectively avoided.

Referring back to FIG. 1A, similar to the die 20a, the die 20b includes a substrate 13b, a pad 14b, a passivation layer 15b, and a connector 19b. The connector 19b includes a seed layer 17b and a conductive post 18b. In some embodiments, the structure and the forming method of the die 20b may be substantially the same as those of the die 20a, but the disclosure is not limited thereto.

In some embodiments, the structure of the die 20b is similar to that of the die 20a, and different from the die 20a in that, the sidewalls of the conductive post 18b in the opening of the protection layer 16b is not covered by the seed layer 17b, but is in contact with the protection layer 16b. The die 20b may be formed by a method the same as or different from the forming method of the die 20a described above.

Figure 1B:
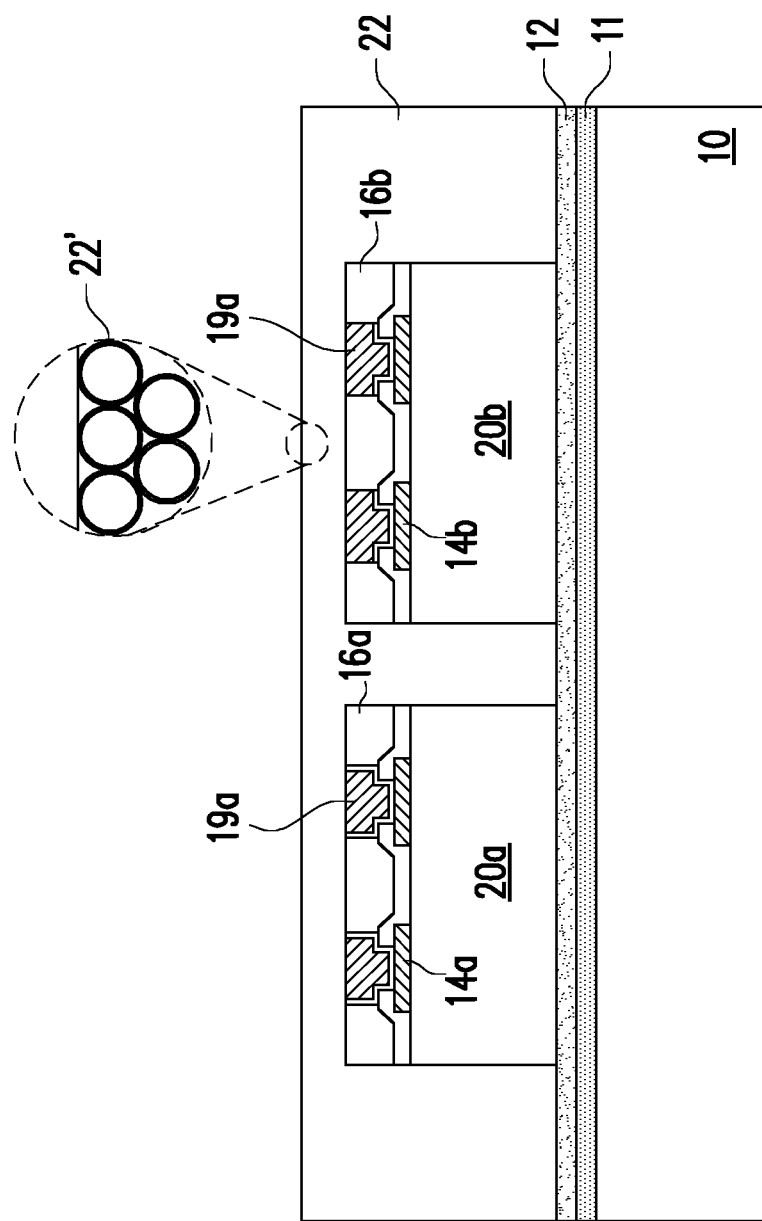

Referring to FIG. 1B, an encapsulant material layer 22 is formed on the carrier 10 and the two dies 20a and 20b by a suitable fabrication technique such as spin-coating, lamination, deposition, molding process or similar processes. The encapsulant material layer 22 encapsulates sidewalls and top surfaces of the dies 20a and 20b. The material of the encapsulant material layer 22 may be the same as or different from the material of the protection layer 16a. In some embodiments, the encapsulant material layer 22 includes a molding compound, a molding underfill, a resin such as epoxy, a combination thereof, or the like. In some other embodiments, the encapsulant 21 includes a photo-sensitive material such as PBO, PI, BCB, a combination thereof, or the like, which may be easily patterned by exposure and development processes or laser drilling process. In alternative embodiments, the encapsulant 21 includes nitride such as silicon nitride, oxide such as silicon oxide, phosphosilicate glass (PSG), borosilicate glass (BSG), boron-doped phosphosilicate glass (BPSG), a combination thereof, or the like.

In yet another embodiment, the encapsulant material layer 22 includes a composite material including a polymer and a plurality of fillers 22'. The filler 22' may be a single element, a compound such as nitride, oxide, or a combination thereof. The fillers 22' may comprise silicon oxide, aluminum oxide, boron nitride, alumina, silica, and the like, for example. The cross-section shape of the filler 22' may be circle, oval, or any other shape. The particle size of the filler 22' ranges from 2 μm to 30 μm, for example. In some embodiments, the particle size is referred to the average particle size D50. In some embodiments, the filler 22' is a hollow filler, but the disclosure is not limited thereto. In some other embodiments, the filler 22' may be a solid filler.

Figure 1C:
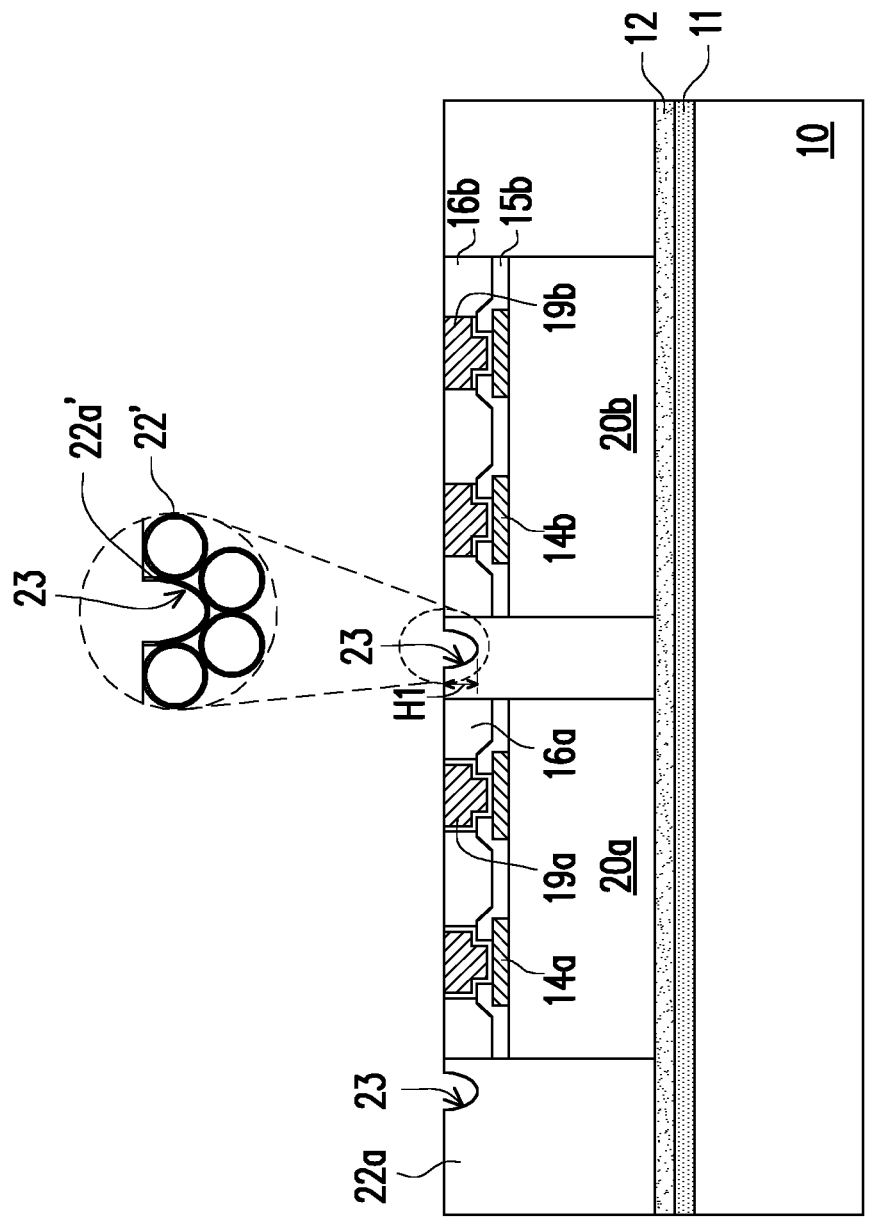

Referring to FIG. 1B and FIG. 1C, a planarization process is performed to remove the encapsulant material layer 22 over the top surfaces of the dies 20a and 20b, and an encapsulant 22a is formed. The planarization process includes a polishing or grinding process, such as a CMP process. In some embodiments, the top surface of the encapsulant 22a and the top surfaces of the dies 20a and 20b are substantially coplanar with each other.

Referring to FIG. 1C, in some embodiments, one or more pits (or referred as recesses) 23 may be formed in the encapsulant 22a after the planarization process. In some embodiments, the height H1 of the pit 23 ranges from 10 μm to 30 μm.

Still referring to FIG. 1B and FIG. 1C, in some embodiments in which the encapsulant material layer 22 includes fillers 22', some of fillers 22' are completely removed, some of the fillers 22' are partially removed during the planarization process. In the embodiments in which the filler 22' is a hollow filler and partially removed, the top of the hollow filler 22' may be removed. In other word, the top of the filler 22a' is open and a filler 22a' having a pit 23 is formed. The height H1 of the pit 23 is related to the particle size of the filler 22'.

Figure 1D:
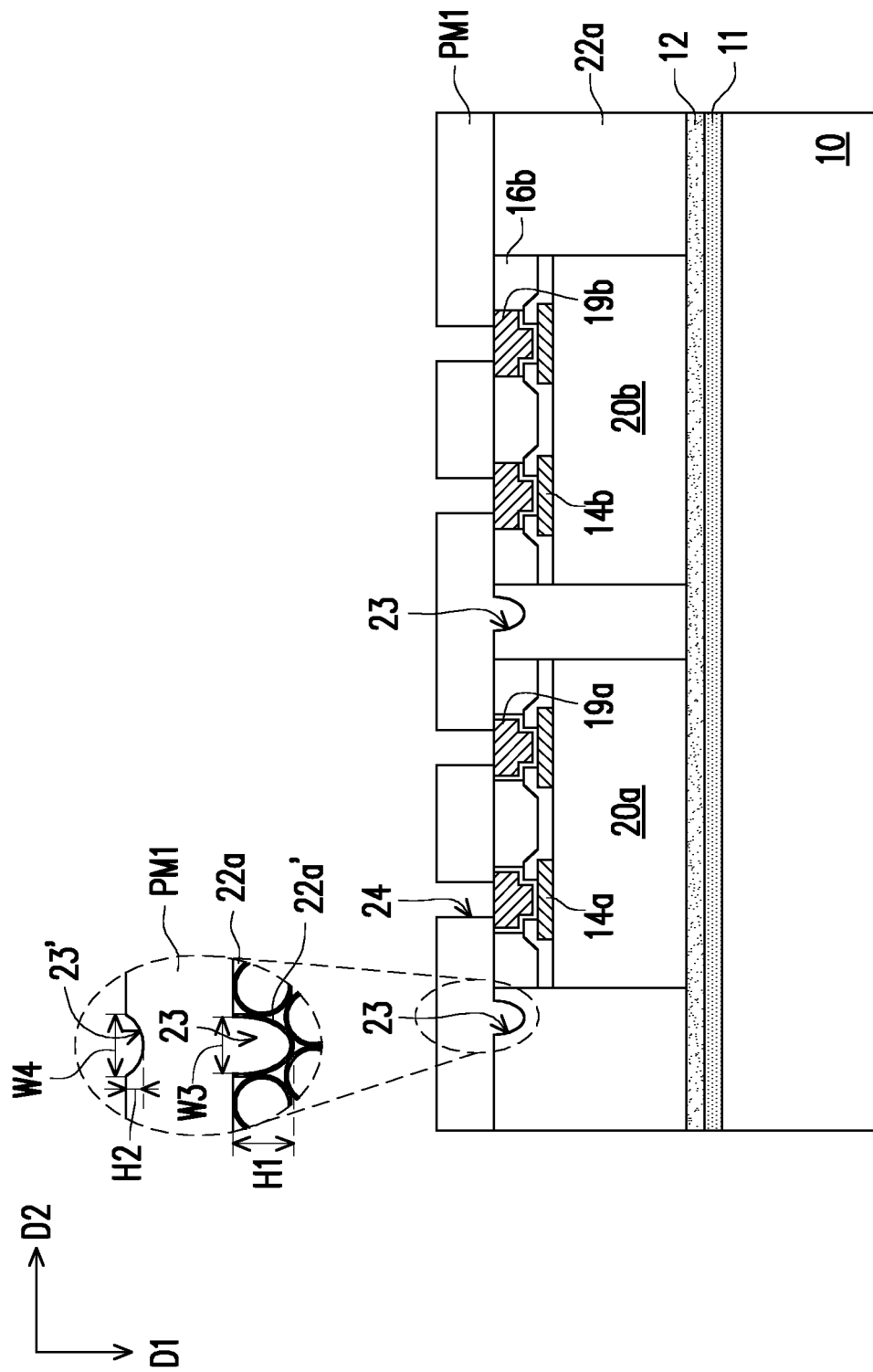

Referring to FIG. 1D, a polymer layer PM1 is formed on the encapsulant 22a and the two dies 20a and 20b. The polymer layer PM1 has a plurality of openings 24. In some embodiment, the openings 24 are via holes, exposing the top surfaces of the connectors 19a of the die 20a and the top surfaces of the connectors 19b of the die 20b. In some embodiments, the cross-section shape of the opening 24 is square, rectangle, trapezoid, inverted trapezoid, or the like. The base angle of the opening 24 is an acute angle, a right angle, or an obtuse angle, for example.

The material of the polymer layer PM1 may be the same as or different from the material of the protection layer 16a and the material of the encapsulant 22a. In some embodiments, the polymer layer PM1 includes a non-shrinkage material. The non-shrinkage material includes, epoxy, phenol, copolymer, or a combination thereof. In some embodiments, the copolymer is formed through a cross-linking reaction between a pre-copolymer and photo acid.

In some embodiments, the polymer layer PM1 may be formed by forming a polymer material layer on the encapsulant 22a and the dies 20a and 20b by a spin coating process and a soft bake process. In some embodiments, the temperature of the soft bake process ranges from 80° C. to 115° C. Thereafter, the polymer material layer is patterned by, for example, exposure and development processes, and a curing process (or referred as hard bake process) is performed to cure the polymer layer PM1. In some embodiments, the temperature of the curing process is higher than the temperature of the soft bake process. In some embodiments, the temperature of the curing process ranges from 170° C. to 230° C. In some embodiments, the temperature of the curing process is higher than 170° C. The shrinkage rate of the polymer layer PM1 after the curing process may be calculated by a method similar to the calculation method of the protection layer 16a. In some embodiments, the shrinkage rate of the polymer layer PM1 ranges from 0 to 2%. That is to say, the ratio of the thickness of the polymer layer PM1 to the thickness of the polymer material layer ranges from 98% to 100%.

Still referring to FIG. 1D, the polymer layer PM1 fills into the pits 23 of the encapsulant 22a. In this embodiment, since the polymer layer is formed of a non-shrinkage material, the problem of pits or recesses that may occur in the polymer layer PM1 during the curing process due to the pits 23 in the encapsulant 22a are effectively avoided or reduced, and the polymer layer PM1 may have a substantially flat top surface. In some embodiments, the surface roughness Ra of the polymer layer PM1 is less than 0.2 μm.

Referring to the enlarged view of the polymer layer PM1 and the encapsulant 22a in FIG. 1D, the polymer layer PM1 is extending into the encapsulant 22a along a first direction DE and is laterally surrounded by the encapsulant 22a along a second direction D2. The first direction D1 is a direction parallel with the normal line of the top surface of the die 20a or 20b. The second direction D2 is a direction parallel with the top surface of the die 20a or 20b. Specifically, the polymer layer PM1 is filled in the pit 23 of the hollow fill 22a' whose top is open. The polymer layer PM1 in the pit 23 is laterally located aside the die 20a or 20b. In some embodiments, the polymer layer PM1 has a recess 23' over the pit 23. The height H2 of the recess 23' is much less than the height H1 of the pit 23. The height H2 of the recess 23' ranges from 0 to 0.2 μm, 0 to 0.1 μm or 0 to 50 nm, for example. It is noted that the height H2 is 0 refers that no recess is formed in the polymer layer PM1. In some embodiments, the height H2 of the recess 23' ranges from 0.1 μm to 0.2 μm. The width W4 of the recess 23' ranges from 10 μm to 30 μm. The aspect ratio (that is, the ratio of height H2 to width W4) of the recess 23' ranges from 0.01 to 0.02. In some embodiments, the height H1 of the pit 23 ranges from 10 μm to 30 μm. The width W3 of the pit 23 ranges from 10 μm to 30 μm. The aspect ratio (that is, the ratio of height H1 to width W3) of the pit 23 ranges from 0.3 to 1. In some embodiments, the width W4 and the width W3 respectively refer to the top width of the recess 23' and the top width of the pit 23.

Figure 1E:
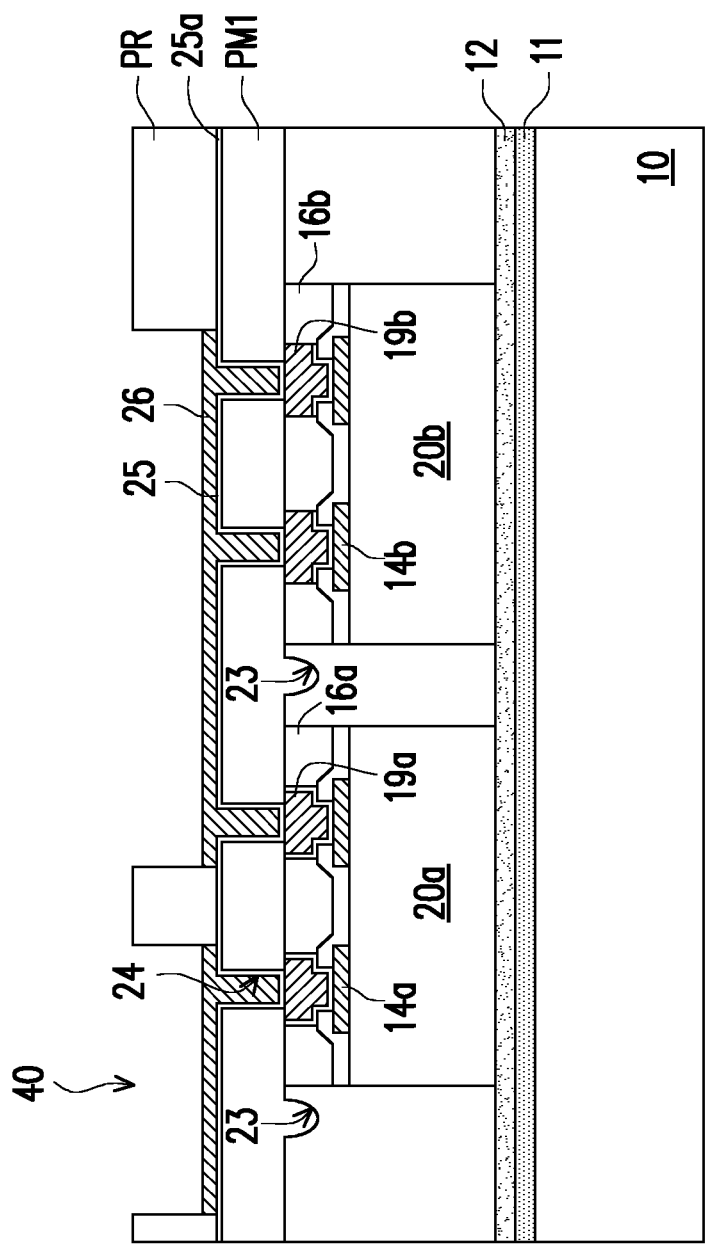

Referring to FIG. 1E, a seed material layer 25a is formed on the polymer layer PM1 by, for example, a sputtering process. The seed layer 25 is a copper seed layer or other suitable metal seed layer. In some embodiments, the seed layer 25 is a composite layer including titanium and copper. In some embodiments, the seed material layer 25a is conformal with the polymer layer PM1. Thereafter, a photoresist PR is formed on the seed material layer 25a. The photoresist PR has a plurality of openings 40. In some embodiments, the openings 40 are trenches, exposing the seed material layer 25a in the openings 24, and a portion of the seed material layer on the top surface of the polymer layer PM1. The conductive layer 26 is then formed on the seed material layer 25a exposed by the openings 40 of the photoresist PR through, for example, an electroplating process. The conductive layer 26 includes copper or other suitable metals, for example.

Figure 1F:
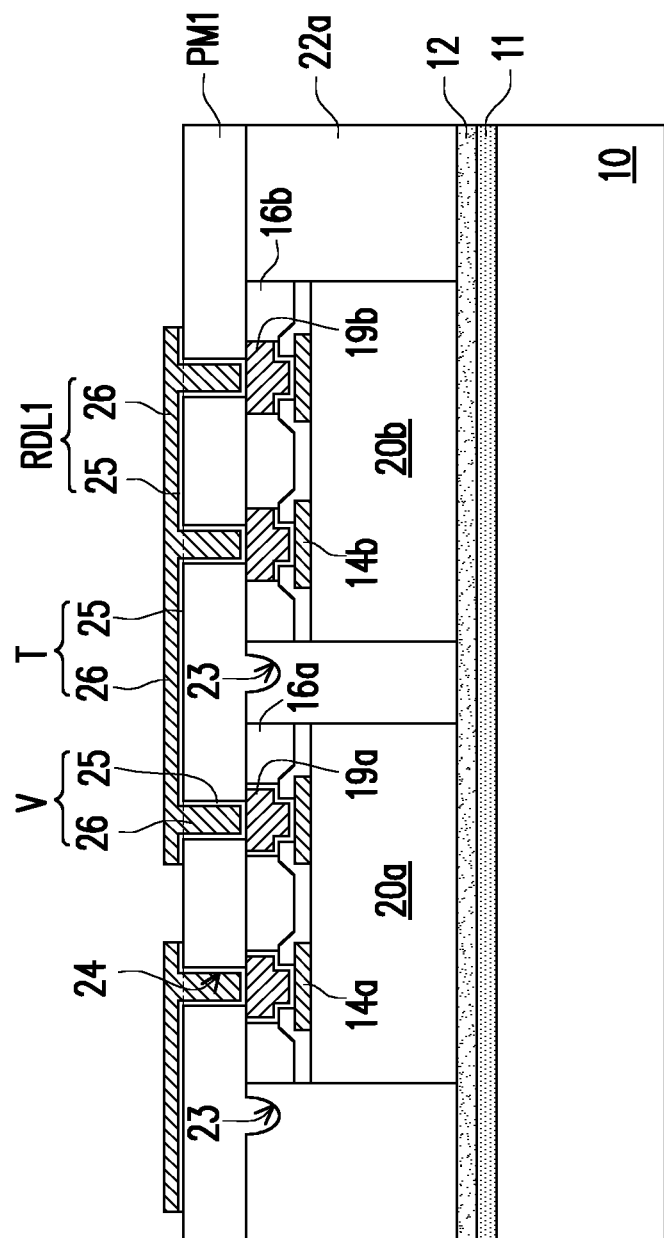

Referring to FIG. 1E and FIG. 1F, the photoresist PR is stripped, and the seed material layer 25a not covered by the conductive layer 26 is removed by an etching process, and the seed layer 25 underlying the conductive layer 26 is formed.

Referring to FIG. 1F, the conductive layer 26 and the underlying seed layer 25 form a redistribution layer RDL1. The redistribution layer RDL1 is on the polymer layer PM1 and on the two dies 20a and 20b. The redistribution layer RDL1 fills into the openings 24 to be in electrical contact with the connectors 19a and 19b. Referring to FIG. 1F, in some embodiments, the redistribution layer RDL1 includes a plurality of vias V and a plurality of traces T connected to each other. The via V is formed of the seed layer 25 and the conductive layer 26 in the opening 24 of the polymer layer PM1, the top (or topmost) surface of the via V is substantially coplanar with the top surface of the polymer layer PM1. The trace T is formed of the seed layer 25 and the conductive layer 26 on the top surface of the polymer layer PM1. The via V penetrates trough the polymer layer PM1 to be in electrical contact with the top surface of the connector 19a/19b. The trace T is extending on the top surface of the polymer layer PM1, and is electrically connected to the connectors 19a/19b through the via V.

Referring to FIG. 4 which is an enlarged view of the RDL1 according to some embodiments of the disclosure, in some embodiments, the redistribution layer RDL1 has a top surface 60 and a top surface 61. In some embodiments, the top surface 60 and the top surface 61 are not coplanar with each other. The top surface 60 is lower than the top surface of the polymer layer PM1, and the top surface 61 is higher than the top surface of the polymer layer PM1, but the disclosure is not limited thereto. In some embodiments, the sidewalls of the via V may be straight or inclined. In some embodiments, the sidewalls of the via V is parallel to the normal line of the top surface of the die 20a/20b. The base angle α of the via V is a right angle, but the disclosure is not limited thereto. In some other embodiments, the base angle α of the via V may be an acute angle, or an obtuse angle. The base angle α may be in a range of 85° to 90°, 90° to 92°, or 90° to 105°, for example. In some embodiments, the top width TCD of the via V equals to the bottom width BCD of the via V. In some embodiments, the top surface of the via V is not flat. The via V has a recess 27 within the opening 24 of the polymer layer PM1. In some embodiments, the recess 27 may have an arced surface, but the disclosure is not limited thereto. The height Δz of the recess 27 ranges from 2 μm to 3 μm, or 1 μm to 3 μm, for example. Herein, the top width TCD of the via V refers to the distance between the end point A and the end point B of the topmost surface 41 of the via V. The height Δz of the recess 27 refers to the height difference between the topmost surface 41 of the via V to the bottommost point of the recess 27.

Figure 1G:
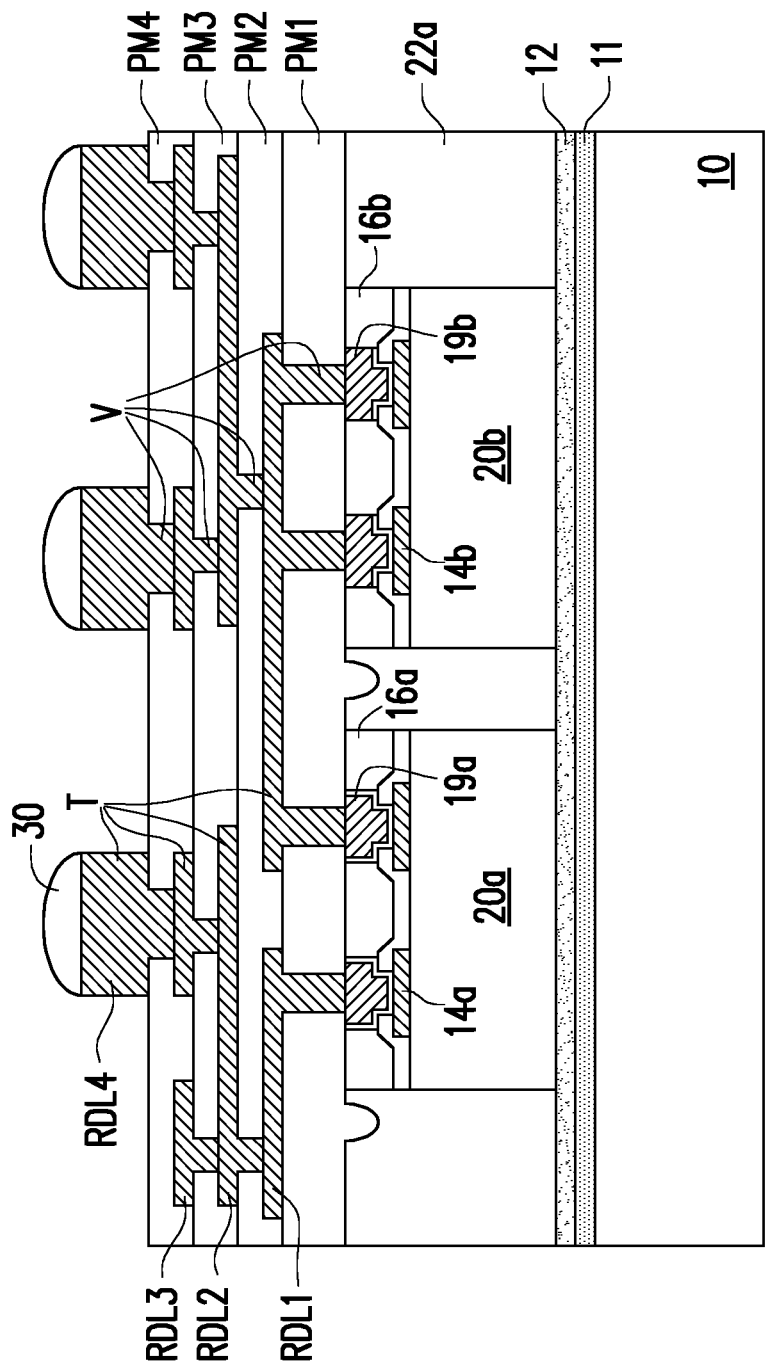

Referring to FIG. 1G, polymer layers PM2, PM3, PM4 and redistribution layers RDL2, RDL3, RDL4 are formed on the polymer layer PM1 and the redistribution layer RDL1. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. The materials and the forming methods of the polymer layers PM2, PM3, PM4 may be similar to or different from those of the polymer layer PM1. In some embodiments, the polymer layers PM2, PM3, PM4 include non-shrinkage materials substantially the same as the material of the polymer layer PM1, but the disclosure is not limited thereto. The structure, materials and the forming methods of the redistribution layers RDL2, RDL3, RDL4 may be similar to or different from those of the redistribution layer RDL1. For the sake of the brevity, the seed layers and the conductive layers in redistribution layers RDL1, RDL2, RDL3, RDL4 are not shown specifically in FIG. 1F. Similarly, the redistribution layers RDL2, RDL3, RDL4 respectively include vias V and traces T. The vias V penetrates through the polymer layers PM1, PM2, PM3 and PM4 to connect the traces T of the redistribution layers RDL1, RDL2, RDL3 and RDL 4, and the traces T are respectively located on the polymer layers PM1, PM2, PM3 and PM4, and are respectively extending on the top surface of the polymer layers PM1, PM2, PM3 and PM4.

The polymer layers PM1, PM2, PM3, PM4 and the redistribution layers RDL1, RDL2, RDL3, RDL4 are stacked alternately, and form a redistribution layer (RDL) structure 28. In some embodiments, the RDL structure 28 is located at a front side (that is, a side close to the connectors 19a and 19b) of the dies 20a and 20b, and is referred as a front side RDL structure. In some embodiments, the die 20a and the die 20b are electrically connected to each other through the RDL structure 28.

In some embodiments, the redistribution layer RDL4 is the topmost redistribution layer of the RDL structure 28, and is also referred as an under-ball metallurgy (UBM) layer for ball mounting.

Thereafter, a plurality of connectors 30 are formed over and electrically connected to the redistribution layer RDL4 of the RDL structure 28. In some embodiments, the connectors 30 are referred as conductive terminals. In some embodiments, the connectors 30 may be ball grid array (BGA) connectors, solder balls, controlled collapse chip connection (C4) bumps, or a combination thereof. In some embodiments, the material of the connector 30 includes copper, aluminum, lead-free alloys (e.g., gold, tin, silver, aluminum, or copper alloys) or lead alloys (e.g., lead-tin alloys). The connector 30 may be formed by a suitable process such as evaporation, plating, ball dropping, screen printing and reflow process, a ball mounting process or a C4 process. In some embodiments, metal posts or metal pillars may further be formed between the redistribution layer RDL4 and the connectors 30. The connectors 30 are electrically connected to the two dies 20a and 20b through the RDL structure 28.

Figure 1H:
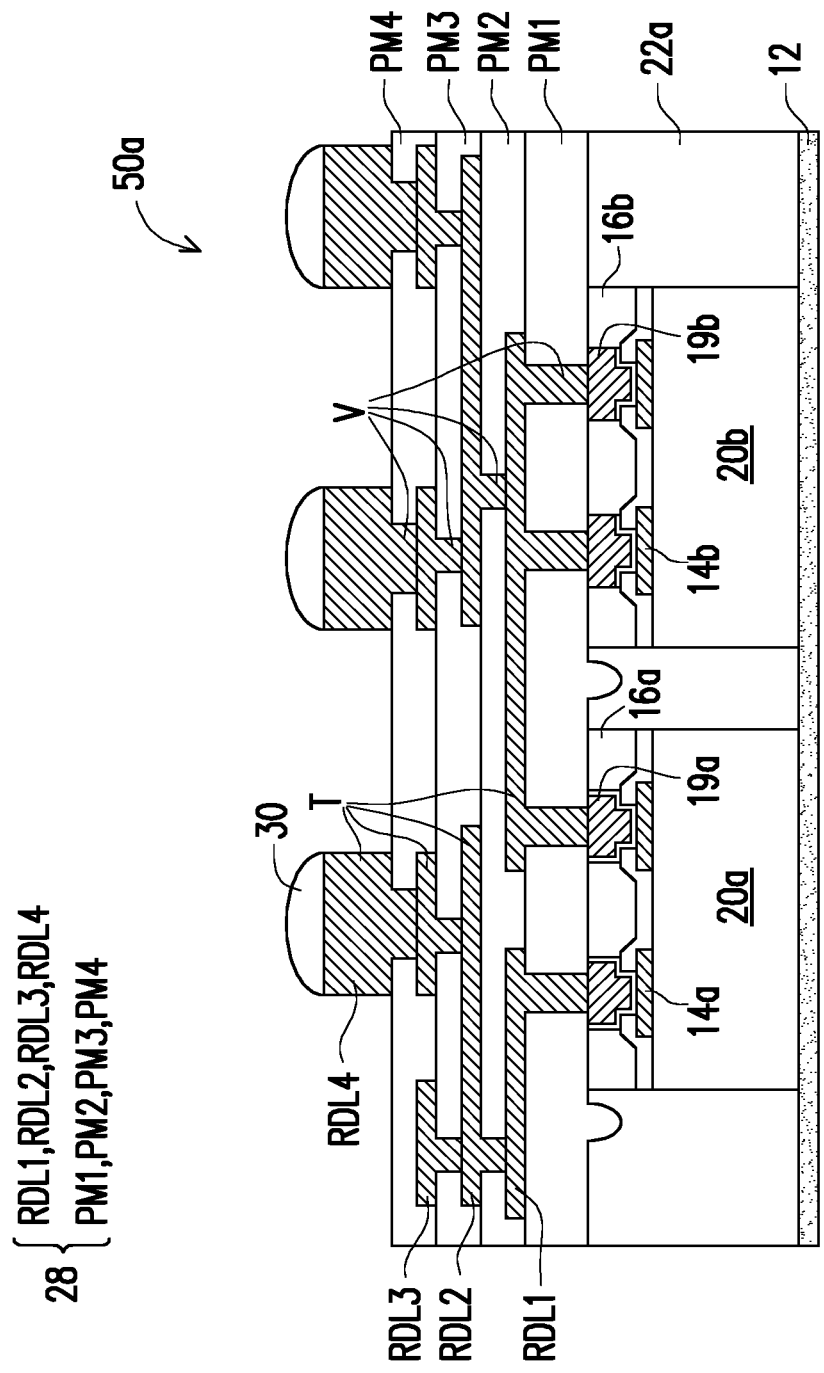

Referring to FIG. 1G and FIG. 1H, the carrier 10 is released with the de-bonding layer 11 decomposed under the heat of light. The adhesive layer 12 may be optionally removed or remained.

Still referring to FIG. 1H, a package structure 50a is thus completed. The package structure 50a includes two dies 20a and 20b, the encapsulant 22a, the RDL structure 28, and the connectors 30. The encapsulant 22a may include pits 23 therein. The protection layer 16a/16b of the die 20a/20b and the polymer layers PM1, PM2, PM3, PM4 include a non-shrinkage material, and have substantially flat top surfaces.

FIG. 2A to FIG. 2F are schematic cross-sectional views illustrating a method of forming a package structure according to a second embodiment of the disclosure. The second embodiment differs from the first embodiment in that a back side RDL structure and a plurality of through integrated fan-out vias (TIVs) are further formed.

Figure 2A:
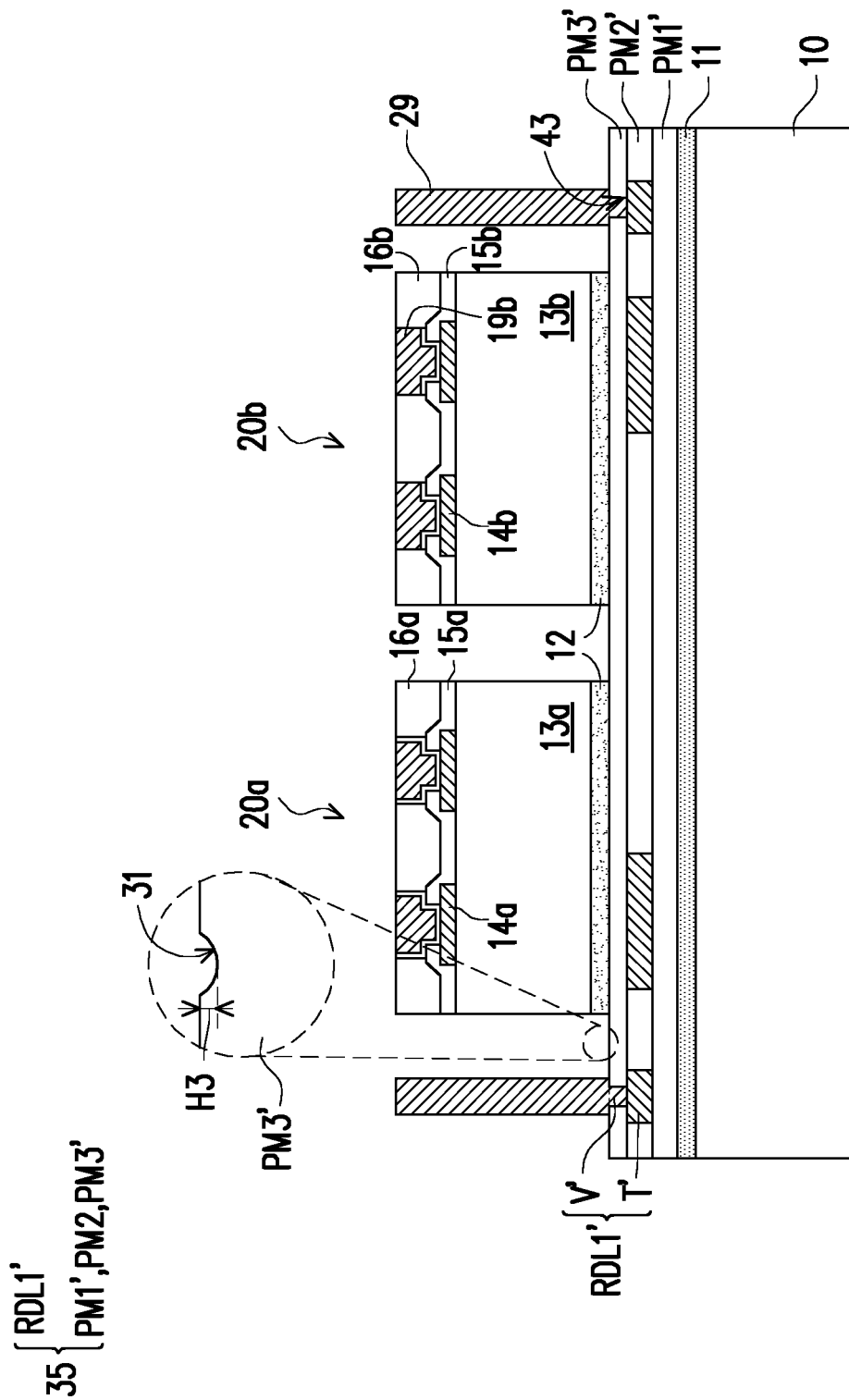
FIG. 2A to FIG. 2E are schematic cross-sectional views illustrating a method of forming a package structure according to a second embodiment of the disclosure.

Referring to FIG. 2A, a carrier 10 is provided. A de-bonding layer 11 is formed on the carrier 10. The materials of the carrier 10 and the de-bonding layer 11 are similar to those in the first embodiment, which is not described again.

A RDL structure 35 is formed on the carrier 10. In some embodiments, the RDL structure 35 includes polymer layers PM1', PM2', PM3' and the redistribution layer RDL1'. The redistribution layer RDL1' includes vias V' and traces T'. The traces T' are extending on the top surface of the polymer layer PM1' and surrounded by the polymer layer PM2'. The via V' penetrates through the polymer layer PM3' to connect to the traces T'. In some embodiments, the top surface of the vias V' are substantially coplanar with the top surface of the polymer layer PM3', but the disclosure is not limited thereto. In some embodiments, the sidewalls of the via V' and the sidewalls of the trace T' may be straight or inclined.

In some embodiments, the polymer layers PM1', PM2', PM3' respectively include a non-shrinkage material. The non-shrinkage material includes, epoxy, phenol, copolymer, or a combination thereof. In some embodiments, the copolymer is formed through a cross-linking reaction between a pre-copolymer and photo acid. The material of the polymer layer PM1', PM2', PM3' may be the same as or different from the material of the polymer layer PM1 described in the first embodiment. The materials of the polymer layers PM1', PM2', PM3' may be the same or different. In some embodiments, the polymer layer PM3' is the topmost polymer layer of the RDL structure 35, and includes a non-shrinkage material, the polymer layers PM1' and PM2' may not include a non-shrinkage material. That is to say, at least the polymer layer PM3' is formed of non-shrinkage material.

Since at least the polymer layers PM3' is formed of non-shrinkage material, the top surface of the polymer layer PM3' is substantially flat. In some embodiments, the surface roughness Ra of the polymer layer PM3' is less than 0.2 μm. In some embodiments, as shown in the enlarged view of the top surface of the polymer layer PM3', the polymer layer PM3' may have a recess 31, the height H3 of the recess 31 is less than 0.2 μm, less than 0.1 μm, or less than 50 nm. In some embodiments, the height H3 may equal to 0, that is to say, no recess is formed in the polymer layer PM3'.

A plurality of through integrated fan-out vias (TIVs) 29 are formed on the RDL structure 35. The TIVs 29 are formed on the vias V', so as to electrically connect to the RDL structure 35. In some embodiments, the TIVs 29 include copper, nickel, solder, alloys thereof, or the like. In some embodiments, the TIV 29 includes a seed layer and a conductive layer formed thereon (not shown). The seed layer is, for example, a titanium or/and copper composited layer. The conductive layer is, for example, a copper layer. An exemplary forming method of the TIVs 29 includes forming a photoresist layer such as a dry film resist on the RDL structure 35. Thereafter, openings (or referred as holes) are formed in the photoresist layer, the openings expose the top surfaces of the vias V', and a portion of the top surface of the polymer layer PM3', and the TIVs 29 are then formed in the openings by electroplating. In some other embodiments, the TIVs 29 further include a barrier layer (not shown) under the seed layer to prevent metal diffusion. The material of the barrier layer includes, for instance, metal nitride such as titanium nitride, tantalum nitride, or a combination thereof.

In some embodiments, the via V' and the TIV 29 may be formed simultaneously, and may be formed by method described as below. In some embodiments, the polymer layer PM3' including a plurality of openings 43 are formed on the polymer layer PM2'. The openings 43 are via holes, exposing a portion of the top surface of the trace T'. The polymer layer PM3' may be formed by forming a polymer material layer on the polymer layer PM2' and the trace T' through, for example, a spin coating process and a soft bake process. Thereafter, the polymer material layer is patterned to form the openings 43 by exposure and development processes, and a curing process. The process parameters (such as the temperature of soft bake process and the temperature of the curing process) for forming the polymer layer PM3' may be substantially the same as those of the polymer layer PM1 (FIG. 1D) as described in the first embodiment. Afterwards, the via V' and the TIV 29 are formed simultaneously on the trace T' exposed by the openings 43 by, for example, sputtering, electroplating, or a combination thereof.

Two dies 20a and 20b are attached to the RDL structure 35 through adhesive layers 12 such as a die attach film (DAF), silver paste, or the like. The dies 20a and 20b are similar to those described in the first embodiment, which is not described again. In this embodiment, the adhesive layer 12 is located between the die 20a/20b and the polymer layer PM3' of the RDL structure 35, the width of the adhesive layer 12 is substantially equal to the width of the die 20a/20b. It is mentioned that, the dies 20a and 20b may be attached to the RDL structure 35 before or after the TIV 29 is formed.

Still referring to FIG. 2A, since the polymer layer PM3' has a substantially flat surface, the problem of void between the adhesive layer 12 and the polymer layer PM3' is avoided or reduced, and the adhesion between the adhesive layer 12 and the polymer layer PM3' is thus increased.

In some embodiments, the dies 20a and 20b are disposed between the TIVs 29. In other words, the TIVs 29 are aside or around the dies 20a and 20b. In some embodiments, the top surfaces of the TIVs 29 are substantially coplanar with the top surfaces of the connectors 19a and 19b of the dies 20a and 20b, but the disclosure is not limited thereto. In some other embodiments, the top surface of the TIVs 29 may be higher than the top surfaces of the dies 20a and 20b.

Figure 2B:
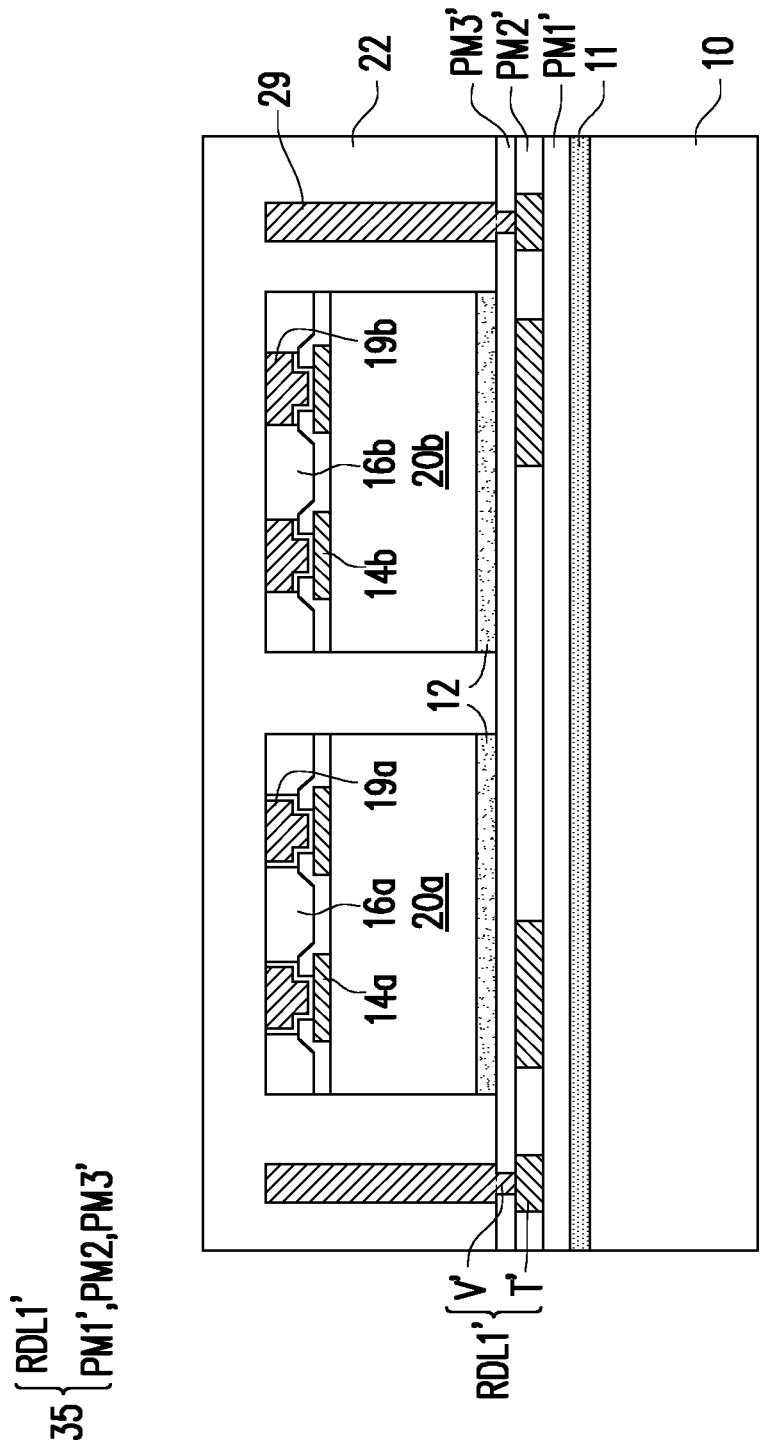

Referring to FIG. 2B, an encapsulant material layer 22 is formed on the RDL structure, the dies 20a and 20b, and the TIVs 29. The encapsulant material layer 22 encapsulates the top surface of the RDL structure 35, the top surfaces and sidewalls of the TIVs 29, the top surfaces and sidewalls of the dies 20a and 20b. The material and the forming method of the encapsulant material layer 22 are substantially the same as those described in the first embodiment, which is not described again.

Figure 2C:
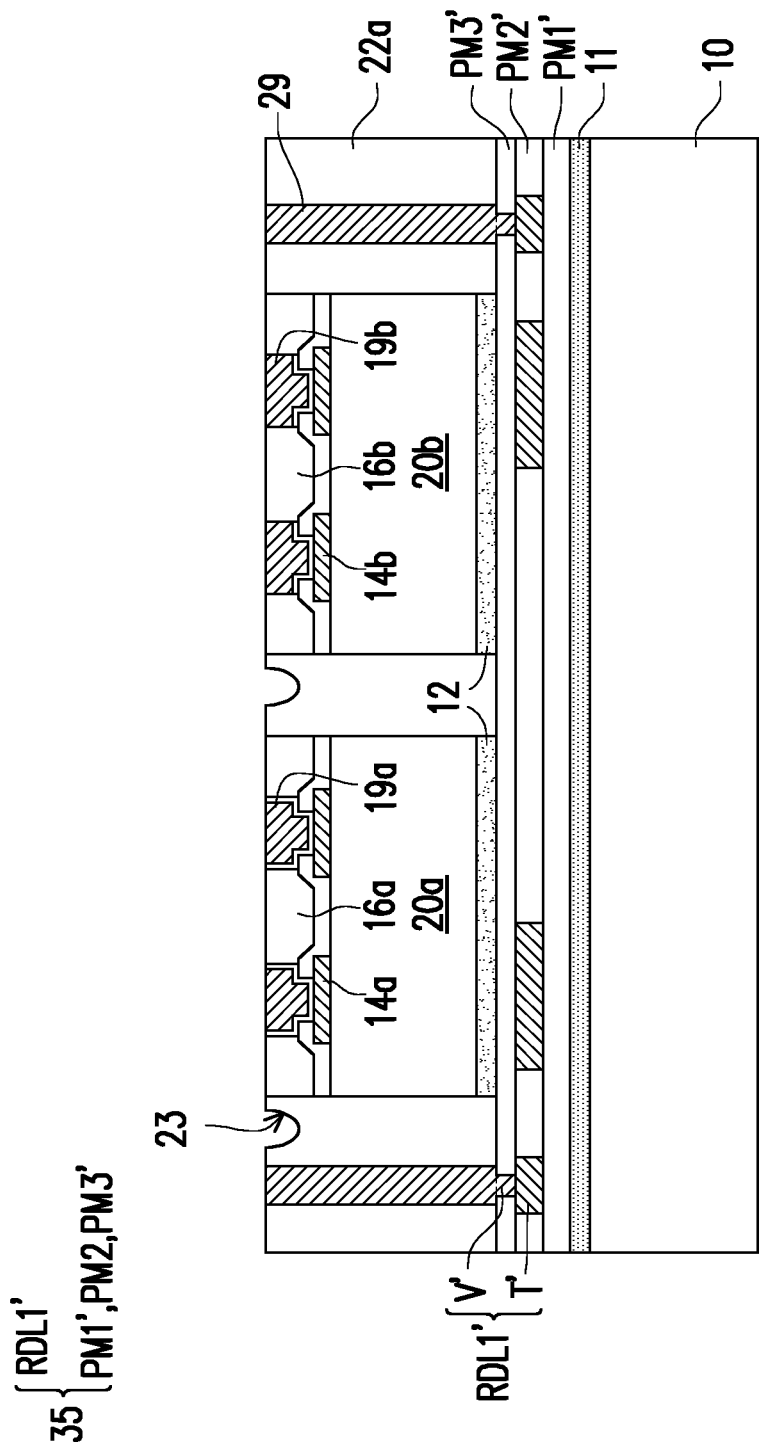

Referring to FIG. 2B and FIG. 2C, a planarization process is performed to at least remove the encapsulant material layer 22 over the top surfaces of the dies 20a and 20b and the TIVs 29, and an encapsulant 22a is formed. The planarization process includes a polishing or grinding process, such as a CMP process. In some embodiments, the top surface of the encapsulant 22a, the top surfaces of the dies 20a and 20b and the top surfaces of the TIVs 29 are substantially coplanar with each other. In the embodiments in which the top surfaces of the TIVs 29 are substantially coplanar with the top surfaces of the connectors 19a and 19b of the dies 20a and 20b, a portion of the encapsulant material layer 22 is removed during the planarization process. In the embodiments in which the top surface of the TIV 29 is higher than the top surfaces of the dies 20a and 20b, a portion of the encapsulant material layer 22 and a portion of the TIVs 29 are removed during the planarization process.

Referring to FIG. 2C, in some embodiments, one or more pits (or referred as recesses) 23 may be formed in the encapsulant 22a after the planarization process.

Figure 2D:
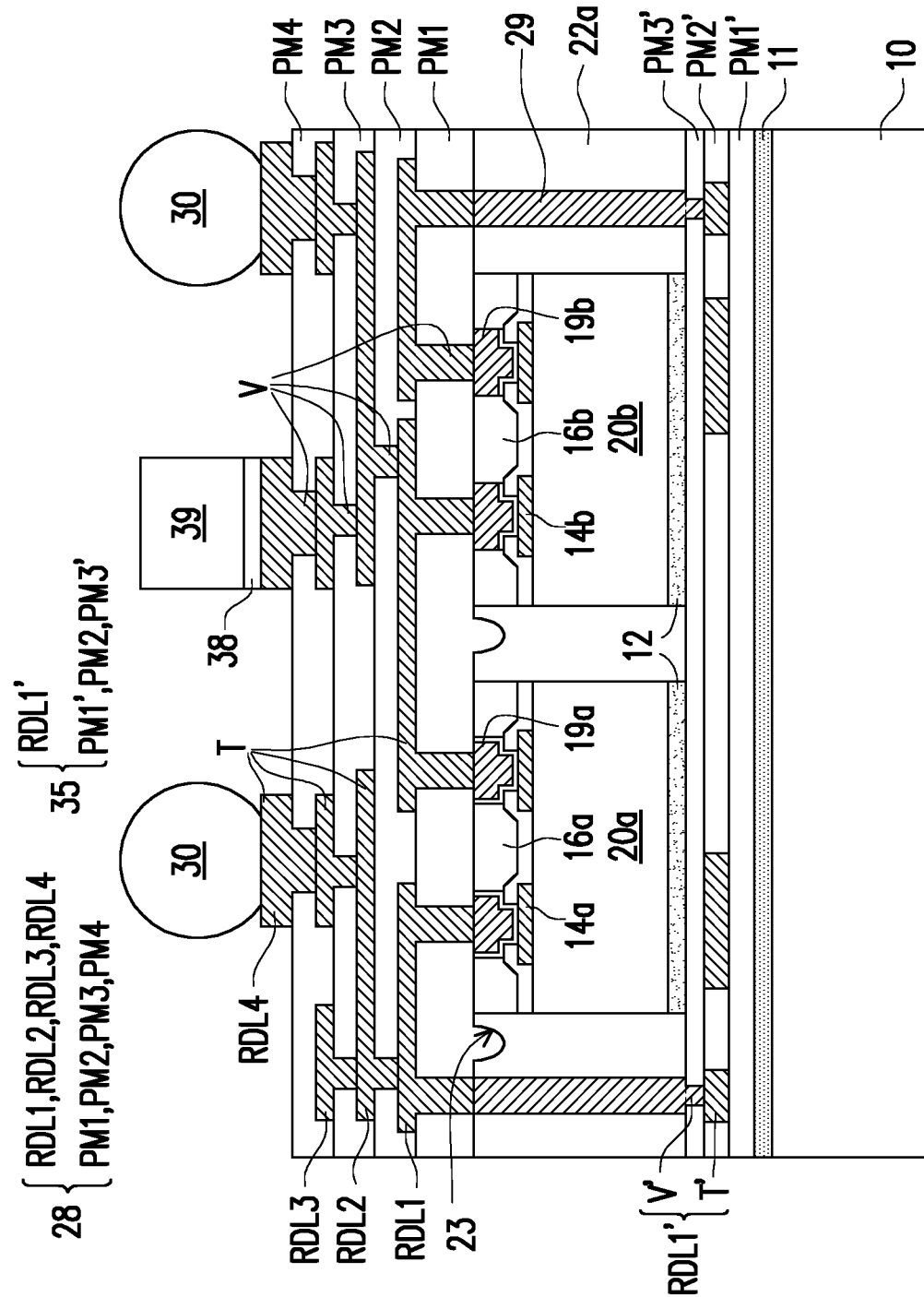

Referring to FIG. 2D, a RDL structure 28 is formed on the encapsulant 22a, the dies 20a and 20b and the TIVs 29. The RDL structure 28 includes polymer layers PM1, PM2, PM3, PM4 and the redistribution layers RDL1, RDL2, RDL3, RDL4 stacked alternately.

The redistribution layer RDL1 penetrates through the polymer layer PM1 and is electrically connected to the connectors 19a and 19b of the dies 20a and 20b. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3.

The redistribution layers RDL1, RDL2, RDL3 and RDL4 respectively includes a plurality of vias V and a plurality of traces T connected to each other. The vias V vertically penetrate through the polymer layers PM1, PM2, PM3 and PM4 to connect the traces T of the redistribution layers RDL1, RDL2, RDL3 and RDL 4, and the traces T are respectively located on the polymer layers PM1, PM2, PM3 and PM4, and are respectively horizontally extending on the top surface of the polymer layers PM1, PM2, PM3 and PM4.

The RDL structure 28 is electrically connected to the connectors 19a and 19b of the dies 20a and 20b and the TIVs 29. The structure, the material and the forming method of the RDL structure 28 is similar to those in the first embodiment, which is not described again.

Figure 2E:
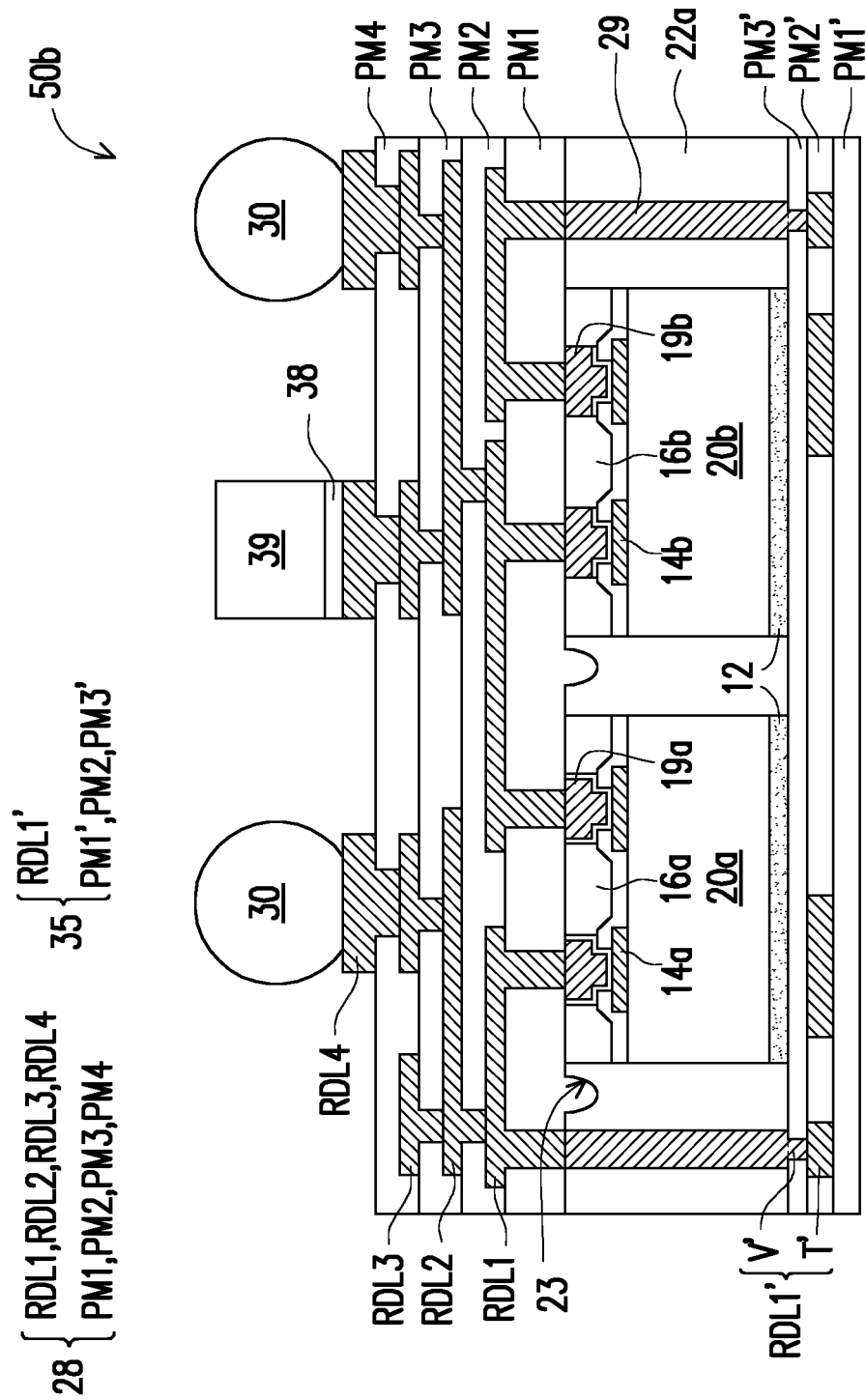

Still referring to FIG. 2D, a plurality of connectors 30 are formed on the redistribution layer RDL4. In some embodiments, a passive device 39 is further connected to the redistribution layer RDL4 through a conductive bump 38 therebetween. In some embodiments, the passive device 39 is an integrated passive device (IPD). In some embodiments, the passive device 39 is a surface-mounting semiconductor device (SMD). The passive device 39 may be a capacitor, a resistor, an inductor or the like, or a combination thereof. The passive device 39 is optionally connected to the RDL structure 28, and the number of the passive device 39 is not limited to that is shown in FIG. 2E, but may be adjusted according to the design of the product. The connectors 30 and the passive device 39 are electrically connected to the connectors 19a and 19b of the dies 20a and 20b through the RDL structure 28.

Referring to FIG. 2E, the carrier 10 is released with the de-bonding layer 11 decomposed under the heat of light. A package structure 50b is thus completed. The package structure 50b includes the RDL structure 35, two dies 20a and 20b, the encapsulant 22a, the TIVs 29, the RDL structure 28, the connectors 30, and the passive device 39. The encapsulant 22a may include pits 23 therein. In some embodiments, the protection layer 16a/16b of the die 20a/20b and the polymer layers PM1', PM2', PM3', PM1, PM2, PM3, PM4 include a non-shrinkage material, and have substantially flat top surfaces.

In the embodiments of the disclosure, the connector of the die is formed after the protection layer is formed, and the protection layer of the die and the polymer layers of the RDL structure are formed of a non-shrinkage material. Therefore, the deformation and bubble issue of the protection layer is avoided or reduced. The problem of recess may occur in the polymer layer due to the pits in the encapsulant is avoided, and the RDL trace broken is thus avoided. On the other hand, in some embodiments, the base angle of the via of the RDL is a right angle, that is, a top width of the via is equal to the bottom width of the via, therefore, more traces are allowed to go through in a certain area.

In accordance with some embodiments of the disclosure, a package structure includes a die, an encapsulant, a polymer layer and a redistribution layer. The encapsulant laterally encapsulates the die. The polymer layer is on the encapsulant and the die. The polymer layer includes an extending portion having a bottom surface lower than a top surface of the die. The polymer layer has a substantially flat top surface. The redistribution layer penetrates through the polymer layer to connect to the die.

In accordance with alternative embodiments of the disclosure, a package structure includes a first die, an encapsulant, and a RDL structure. The first die includes a first connector and a first protection layer laterally aside the first connector. The first connector includes a first seed layer and a first conductive post on the first seed layer. The encapsulant laterally encapsulates the first die. The RDL structure is on the first die and the encapsulant. The first seed layer is in contact with the RDL structure.

In accordance with some embodiments of the disclosure, a method of forming a package structure includes the following processes. A die including a connector and a protection layer is formed. The protection layer laterally surrounds the connector, wherein the connector is formed after forming the protection layer. An encapsulant is formed to laterally encapsulate the die. A RDL structure is formed on the die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die;
   an encapsulant, laterally encapsulating the die;
   a polymer layer on the encapsulant and the die, wherein the polymer layer comprises an extending portion having a bottom surface lower than a top surface of the die, and the polymer layer has a substantially flat top surface, wherein the extending portion of the polymer layer extends into a filler of the encapsulant; and
   a redistribution layer penetrating through the polymer layer to connect to the die.

2. The package structure of claim 1, wherein the extending portion of the polymer layer is laterally surrounded by the filler of the encapsulant.

3. The package structure of claim 1, wherein the extending portion of the polymer layer is in contact with an inner sidewall of the filler.

4. The package structure of claim 1, wherein the polymer layer comprises a first portion directly on the die, and a second portion comprising the extending portion which is directly on a portion of the encapsulant, a second thickness of the second portion is larger than a first thickness of the first portion.

5. The package structure of claim 1, wherein the encapsulant has a first pit, and the extending portion of the polymer layer is filled in the first pit.

6. The package structure of claim 5, wherein the polymer layer has a second pit directly over the first pit, and a height of the second pit is less than a height of the first pit.

7. The package structure of claim 5, wherein the polymer layer is free of pit directly over the first pit.

8. The package structure of claim 1, wherein
   the redistribution layer comprises a via embedded in the polymer layer and a trace extending on a top surface of the polymer layer; and
   a base angle of the via is a right angle or an acute angle.

9. The package structure of claim 8, wherein a top surface of the via is lower than a top surface of the polymer layer.

10. A package structure, comprising:
    a first die, comprising a first connector and a first protection layer laterally aside the first connector, the first connector comprises a first seed layer and a first conductive post, wherein the first conductive post is disposed on and laterally surrounded by the first seed layer;
    an encapsulant, laterally encapsulating the first die; and
    a redistribution layer (RDL) structure on the first die and the encapsulant,
    wherein the first seed layer is in contact with the RDL structure.

11. The package structure of claim 10, wherein a portion of the first seed layer is laterally sandwiched between the first conductive post and the first protection layer and has a top surface in contact with the RDL structure.

12. The package structure of claim 10, wherein the first conductive post is separated from the first protection layer by the first seed layer therebetween.

13. The package structure of claim 10, wherein a portion of the encapsulant is laterally between a polymer layer of the RDL structure and the first protection layer.

14. The package structure of claim 10, wherein the RDL structure comprises a polymer layer covering the die and the encapsulant, and a surface roughness of a top surface of the polymer layer is less than a surface roughness of a top surface of the encapsulant.

15. The package structure of claim 10, further comprising:
    a second die laterally aside the first die and encapsulated by the encapsulant, the second die comprises a second connector and a second protection layer laterally aside the second connector, the second connector comprises a second seed layer and a second conductive post on the second seed layer;
    wherein the second seed layer is separated from the RDL structure by the second conductive post therebetween.

16. A method of forming a package structure, comprising:
    forming a die comprising a connector and a protection layer laterally aside and surrounding the connector, wherein the connector is formed after forming the protection layer, the connector comprises a seed layer and a conductive post, wherein the conductive post is disposed on and laterally surrounded by the seed layer;
    forming an encapsulant to laterally encapsulate the die; and
    forming a RDL structure on the die and the encapsulant, wherein the seed layer is in contact with the RDL structure.

17. The method of claim 16, wherein forming the protection layer comprises:
    forming a protection material layer to cover a conductive pad of the die;
    patterning the protection material layer to form the protection layer; and
    performing a curing process to cure the protection layer, wherein a shrinkage rate of protection layer after the curing process with respect to the protection material layer before the curing process ranges from 0 to 2%.

18. The method of claim 17, wherein forming the protection material layer comprises performing a soft bake process on the protection material layer, and the curing process is performed at a temperature higher than that of the soft bake process.

19. The method of claim 17, wherein patterning the protection material layer comprises forming an opening in the protection layer exposing the conductive pad of the die, and the connector is formed on the conductive pad within the opening of the protection layer.

20. The method of claim 19, wherein forming the connector comprises:
   forming a seed material layer on the protection layer and filling into the opening;
   forming a conductive material layer on the seed material layer and filling into the opening; and
   performing a patterning process to remove portions of the seed material layer and the conductive material layer over a top surface of the protection layer.

\* \* \* \* \*